(12) United States Patent
Takami et al.

(10) Patent No.: US 8,877,021 B2
(45) Date of Patent: Nov. 4, 2014

(54) CHROMIC OXIDE POWDER FOR SPUTTERING TARGET, AND SPUTTERING TARGET MANUFACTURED FROM SUCH CHROMIC OXIDE POWDER

(75) Inventors: Hideo Takami, Ibaraki (JP); Masataka Yahagi, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 1807 days.

(21) Appl. No.: 11/916,301

(22) PCT Filed: Mar. 10, 2006

(86) PCT No.: PCT/JP2006/304737
§ 371 (c)(1),
(2), (4) Date: Dec. 3, 2007

(87) PCT Pub. No.: WO2006/134694
PCT Pub. Date: Dec. 21, 2006

(65) Prior Publication Data
US 2009/0139859 A1    Jun. 4, 2009

(30) Foreign Application Priority Data

Jun. 15, 2005   (JP) .................................. 2005-175224

(51) Int. Cl.
| | | |
|---|---|---|
| *C23C 14/00* | (2006.01) | |
| *C25B 9/00* | (2006.01) | |
| *C25B 11/00* | (2006.01) | |
| *C25B 13/00* | (2006.01) | |
| *C04B 35/00* | (2006.01) | |
| *C09D 5/23* | (2006.01) | |
| *H01F 1/00* | (2006.01) | |
| *H01L 29/12* | (2006.01) | |
| *C22C 32/00* | (2006.01) | |
| *C01G 37/033* | (2006.01) | |
| *C23C 14/34* | (2006.01) | |
| *C04B 35/645* | (2006.01) | |
| *C04B 35/12* | (2006.01) | |
| *C04B 35/626* | (2006.01) | |

(52) U.S. Cl.
CPC .......... *C23C 14/3414* (2013.01); *C01G 37/033* (2013.01); *C04B 35/645* (2013.01); *C04B 2235/3251* (2013.01); *C04B 2235/77* (2013.01); *C04B 2235/72* (2013.01); *C04B 2235/446* (2013.01); *C04B 35/12* (2013.01); *C04B 2235/726* (2013.01); *C01P 2006/80* (2013.01); *C01P 2004/61* (2013.01); *C04B 35/62645* (2013.01); *C04B 2235/5436* (2013.01); *C04B 2235/721* (2013.01); *C04B 2235/724* (2013.01)
USPC .......... 204/298.13; 204/298.12; 252/62.51 C; 419/19

(58) Field of Classification Search
CPC ................ B22F 1/00; B22F 3/15; B22F 3/12; B22F 2301/20; C22C 27/06; C22C 32/0026; C01G 37/02; C01G 37/027; C01G 37/033; C23C 14/083; C23C 14/08; H01J 37/3426
USPC ................ 204/298.13, 298.12; 252/62.51 C; 419/19
See application file for complete search history.

(56) References Cited

U.S. PATENT DOCUMENTS

| | | | |
|---|---|---|---|
| 4,207,295 A | 6/1980 | Kagetsu et al. | |
| 4,296,076 A * | 10/1981 | Swales et al. | .................... 423/53 |
| 5,320,729 A * | 6/1994 | Narizuka et al. | ......... 204/298.13 |
| 5,397,373 A | 3/1995 | Tomioka et al. | |
| 5,561,833 A * | 10/1996 | Tomioka et al. | ................. 419/19 |
| 6,039,788 A * | 3/2000 | Lam et al. | ........................ 75/623 |
| 7,635,440 B2 * | 12/2009 | Hosono et al. | ........... 252/519.51 |
| 2006/0086610 A1 | 4/2006 | Takami et al. | |
| 2006/0147740 A1 | 7/2006 | Hosono et al. | |
| 2007/0074790 A1 | 4/2007 | Yamakoshi et al. | |
| 2007/0111894 A1 | 5/2007 | Suzuki | |
| 2007/0187236 A1 | 8/2007 | Nakamura et al. | |
| 2007/0209547 A1 | 9/2007 | Irumata et al. | |
| 2007/0297932 A1 | 12/2007 | Takami et al. | |
| 2008/0299415 A1 | 12/2008 | Hosono et al. | |

FOREIGN PATENT DOCUMENTS

| | | | |
|---|---|---|---|
| CN | 1397661 A | | 2/2003 |
| JP | 54-141808 A | | 11/1979 |
| JP | S63-45125 A | | 2/1988 |
| JP | 02275814 A | * | 11/1990 |
| JP | H04-132659 A | | 5/1992 |

(Continued)

OTHER PUBLICATIONS

'Paste' definition. Merriam-Webster Online Dictionary [http://www.merriam-webster.com/dictionary/paste] [Accessed on Jan. 24, 2014].*
ESP@CENET Database, English Abstract of JP 08-073963, Mar. 19, 1995.
ESP@CENET Database, English Abstract of JP 06-264159, Sep. 20, 1994.

(Continued)

*Primary Examiner* — Michael Band
(74) *Attorney, Agent, or Firm* — Howson & Howson LLP

(57) ABSTRACT

Provided is chromic oxide powder for a sputtering target comprised of chromic oxide wherein sulfur is 100 wtppm or less. This sputtering target contains chromic oxide of 5 molar % or higher or chromic oxide, wherein the sulfur content in the sputtering target is 100 wtppm or less, and the purity excluding gas components of moisture, carbon, nitrogen and sulfur is 99.95 wt % or higher. The chromic oxide powder for a sputtering target is able to increase the purity of the chromic oxide itself as well as increase the sintered density upon manufacturing a sputtering target. As a result of manufacturing a sputtering target using this chromic oxide powder, the crystal grains are refined, and provided is a uniform and dense sputtering target that does not generate cracks.

5 Claims, No Drawings

(56) References Cited

FOREIGN PATENT DOCUMENTS

| JP | 04323366 | A | * | 11/1992 |
|---|---|---|---|---|
| JP | H06-264159 | A | | 9/1994 |
| JP | H08-073963 | A | | 3/1996 |
| JP | H08-199349 | A | | 8/1996 |
| JP | H09-235667 | A | | 9/1997 |
| JP | 09-279334 | A | | 10/1997 |
| JP | 2003-105532 | A | | 4/2003 |
| SU | 1168511 | A1 | | 7/1985 |

OTHER PUBLICATIONS

ESP@CENET Database, English Abstract of JP 08-199349, Aug. 6, 1996.
ESP@CENET Database, English Abstract of JP 04-132659, May 6, 1992.
ESP@CENET Database, English Abstract of JP 09-235667, Sep. 9, 1997.
Zhang et al., "Preparation of Cr2O3 Fine Powder by Solid-Phase Reaction", Journal of Bejing University of Chemical Technology, vol. 29, No. 1, pp. 71-74, 2002 (month unknown).

* cited by examiner

US 8,877,021 B2

CHROMIC OXIDE POWDER FOR SPUTTERING TARGET, AND SPUTTERING TARGET MANUFACTURED FROM SUCH CHROMIC OXIDE POWDER

BACKGROUND OF THE INVENTION

The present invention pertains to chromic oxide powder for a sputtering target capable for providing a high-purity and high-density sputtering target that does not generate cracks, and to a sputtering target sintered using such chromic oxide powder.

Chromic oxide or a sintered compact target containing chromic oxide is employed as a target material used for forming, via sputtering, thin films or layers such as an abrasion-resistant protective film, a magnetic recording medium or a magnetic recording medium base film of a thermal head; a black matrix film of a liquid crystal display (LCD) panel; a heat element base film; a dielectric film for a phase-change optical recording medium and the like.

Generally, chromic oxide or a target containing chromic oxide usually cracks easily, and is of low density and low purity. When a target has low density or low purity, such target affects the characteristics of the thin film in various ways.

When the purity is low and there are many impurities, such impurities often become the source for the generation of particles and nodules during sputtering, and cause the occurrence of abnormal discharge and variation in the deposition speed and film composition.

In addition, since the deterioration of density increases pores, coarsens crystal grains, and makes the sputtered surface of the target uneven and rough, such deterioration of density will similarly cause the generation of particles and nodules during sputtering and deterioration in the characteristics of the sputtered film.

Nevertheless, as described above, since chromic oxide or a target containing chromic oxide cracks easily, there is a problem in that it is difficult to density such chromic oxide or target containing chromic oxide. Thus, there were not many cases of proactively adding chromic oxide or using chromic oxide itself as the target material.

Under the foregoing circumstances, technology has been disclosed for adjusting the porosity within the range of 35% or less upon calcinating a chromic oxide compact and manufacturing a sintered compact (for instance, refer to Patent Document 1). In this case, commercially available green chromic oxide powder is sintered as the raw material, and although this level of improvement would suffice for use as a fire-resistant material, it is evident that sufficient characteristics cannot be obtained as a sputtering target material.

An example is also disclosed of using a chrome target containing high concentration of oxygen as a base thin film of a magnetic recording medium (refer to Patent Document 2).

In this case, since chrome has a low solid solubility limit of oxygen, when a considerable amount of oxygen is contained, it will be included as chromic oxide in the form of a non-metal inclusion. If this inclusion exists randomly, the following problems have been indicated; namely, that electrification or local abnormal discharge of the chromic oxide as an inclusion will occur during the deposition by sputtering, and the inclusion will desorb from the target and float in the deposition bath.

As a measure for improving the foregoing situation, a proposal has been made for finely and uniformly dispersing chromic oxide in metal chromium. In addition, in this case, a proposal has also been made for adding chromic oxide powder to metal chromium powder, and finely and uniformly dispersing chromic oxide in metal chromium via heat treatment in a similar fashion (for instance, refer to Patent Document 3).

Nevertheless, in the foregoing cases, since the problems of purity of the chromic oxide itself and low density of the target resulting from the inclusion of chromic oxide have not been resolved, these technologies do not offer a fundamental solution for the manufacture of sputtering targets containing chromium oxide.

In addition, as a sputtering target for forming a chromic oxide thin film to be used in the black matrix of LCD panels, a proposal has been made for a manufacturing method of a chrome target comprised of metal chromium and chromic oxide (for instance, refer to Patent Document 4). In this case, since the chromic oxide is uniformly dispersed in the metal chromium and is also dense, the discharge voltage is stable and the deposition is favorable.

As a specific manufacturing example, carbide of chrome is mixed to commercially available chromic oxide and calcinated, reduced and pulverized, and thereafter subject to secondary sintering in a vacuum so as to uniformly disperse chromic oxide in the metal chromium for obtaining a dense target. Even in this case, there is no particular improvement in the purity of chromic oxide, and there is a new problem of C getting mixed in. Thus, this technology does not offer a fundamental solution for the manufacture of sputtering targets containing chromic oxide.

As a similar method, a proposal has been made wherein carbon powder is mixed to commercially available chromic oxide and calcinated, reduced and pulverized, and thereafter subject to sintering so as to uniformly disperse chromic oxide in the metal chromium for stabilizing the discharge and inhibiting the generation of particles (refer to Patent Document 5).

Nevertheless, even in this case, there is no particular improvement in the purity of chromic oxide, and there is a new problem of C getting mixed in. Thus, this technology does not offer a fundamental solution for the manufacture of sputtering targets containing chromic oxide.

Furthermore, a proposal has been made for a method of obtaining an abrasion-resistant, high-strength and high-toughness sintered compact for used in bearings or the like. Such compact is obtained by placing a mixed compact of commercially available chromic oxide and zirconium oxide in graphite powder and performing sintering thereto (for instance, refer to Patent Document 6). Even in this case, there is no particular improvement in the purity of chromic oxide, and there is a new problem of C getting mixed in from the perspective of the sintering atmosphere. Thus, this technology does not offer a fundamental solution for the manufacture of sputtering targets containing chromic oxide.

[Patent Document 1] Japanese Patent Laid-Open Publication No. S54-141808
[Patent Document 2] Japanese Patent Laid-Open Publication No. H8-73963
[Patent Document 3] Japanese Patent Laid-Open Publication No. H6-264159
[Patent Document 4] Japanese Patent Laid-Open Publication No. H8-199349
[Patent Document 5] Japanese Patent Laid-Open Publication No. H9-279334
[Patent Document 6] Japanese Patent Laid-Open Publication No. H4-132659

SUMMARY OF THE INVENTION

Thus, an object of the present invention is to provide chromic oxide powder for a sputtering target capable of increasing the purity of the chromic oxide itself as well as increasing the sintered density upon manufacturing a sputtering target. Another object of the present invention is to refine the crystal grains upon manufacturing a sputtering target using such chromic oxide powder so as to provide a uniform and dense sputtering target that does not generate cracks, and is capable of inhibiting the generation of particles and nodules caused by impurities as well as the occurrence of abnormal discharge.

In order to achieve the foregoing object, as a result of intense study, the present inventors discovered that it is extremely important to improve the purity of the chromic oxide powder itself, and it is possible to improve the deposition characteristics by realizing the optimal conditions of the target density, crystal grain size and relative density.

Based on the foregoing discovery, the present invention provides:
1) Chromic oxide powder for a sputtering target, wherein sulfur is 100 wtppm or less, and purity excluding gas components of moisture, carbon, nitrogen and sulfur is 99.95 wt % or higher;
2) The chromic oxide powder for a sputtering target according to paragraph 1) above, wherein sulfur is 30 wtppm or less;
3) The chromic oxide powder for a sputtering target according to paragraph 1) or paragraph 2) above, wherein the carbon content is 200 wtppm or less;
4) The chromic oxide powder for a sputtering target according to any one of paragraphs 1) to 3) above, wherein the purity excluding gas components, such as moisture, carbon, nitrogen and sulfur, is 99.95 wt % or higher; and
5) The chromic oxide powder for a sputtering target according to any one of paragraphs 1) to 4) above, wherein the weight loss during intense heating under an inert atmosphere at 1000° C. for 2 hours is 0.7% or less.

The present invention additionally provides:
6) Chromic oxide in which the sulfur content in the sputtering target is 100 wtppm or less, and the purity excluding gas components of moisture, carbon, nitrogen and sulfur is 99.95 wt % or higher, or a sputtering target containing chromic oxide of 5 molar % or higher;
7) The sputtering target according to paragraph 6) above, wherein the sulfur content is 30 wtppm or less;
8) The sputtering target according to paragraph 6) or paragraph 7) above, wherein the carbon content is 200 wtppm or less;
9) The sputtering target according to any one of paragraphs 6) to 8) above, wherein the total amount of Na, Fe and Pb as impurities is 300 wtppm or less;
10) The sputtering target according to any one of paragraphs 6) to 9) above containing chromic oxide of 20 molar % or higher;
11) The sputtering target according to paragraph 10) above containing chromic oxide of 50 molar % or higher; and
12) The sputtering target according to any one of paragraphs 6) to 11) above, wherein the average crystal grain size is 100 µm or less, and the relative density is 90% or higher.

DETAILED DESCRIPTION OF THE INVENTION

The present invention yields a superior effect of being able to increase the purity of chromic oxide itself, and of particular being able to prevent cracks, increase the sintered density and inhibit pores upon manufacturing a sputtering target by reducing sulfur and carbon as much as possible. In addition, the present invention provides chromic oxide powder for a sputtering target adaptable to the above, and yields a significant effect of being able to refine the crystal grains upon manufacturing the sputtering target and thereby provide a uniform and dense sputtering target capable of inhibiting the generation of particles and nodules caused by impurities as well as the occurrence of abnormal discharge.

A significant feature of the chromic oxide powder for a sputtering target and the sputtering target manufactured using such chromic oxide powder according to the present invention is that the sulfur content in the chromic oxide powder, chromic oxide or the sputtering target containing chromic oxide is 100 wtppm or less. Although chromic oxide as used herein primarily implies $Cr_2O_3$, it is not necessarily limited to $Cr_2O_3$. In other words, chromic oxide can also be represented as $Cr_5O_{12}$, $Cr_3O_4$, $CrO_2$, $CrO$, $Cr_3O_2$ and so on, and all of these chromic oxides and their compounds correspond to the term "chromic oxide" as used herein.

Generally, commercially available chromic oxide powder is manufactured by calcinating chromic anhydride, but a sulfate radical ($SO_4^{-2}$) will remain, and sulfur will consequently remain in the chromic oxide powder. With an ordinary sintered compact, a sintered compact or a sintered target is manufactured by ignoring the existence of such sulfur. Therefore, although the cause of cracks in the target is unclear, low density targets were conventionally manufactured from the perspective of preventing cracks.

Nevertheless, it has been discovered that the existence of sulfur in an amount greater than a given quantity is a direct and significant cause of generating cracks in the target. Therefore, it is necessary to strictly limit the sulfur content in the chromic oxide. In order to reduce the sulfur content in the sputtering target, it is necessary to reduce the sulfur content of the chromic oxide powder to become the sintering raw material as a matter of course. Preferable sulfur content is 30 wtppm or less.

Although there is a slight difference in the sulfur content of the sintering raw material powder and the target, the mixture of sulfur is usually attributable to the chromic oxide sintering raw material powder, and this is directly reflected on the target. Nevertheless, if there is any mixture of sulfur from another material, it is necessary to limit such sulfur as well, and it is essential to reduce the total amount of sulfur in the target.

In order to reduce sulfur, it is effective to perform heat treatment to the raw material chromic oxide powder in the atmosphere, oxygen gas atmosphere (or flow), inert gas atmosphere (or flow), or vacuum at a temperature of roughly 900° C. to 1200° C. It is thereby possible to significantly reduce the gas components such as moisture, sulfur, carbon, oxygen (free) and nitrogen contained in the chromic oxide. Moreover, since the fluidity of the chromic oxide raw material powder will also increase, it is possible to eliminate many of the factors that cause cracks in the target during sintering.

In particular, since sulfur will evaporate when heated at a temperature of 900° C. or higher, sulfur can be effectively eliminated at such a temperature. Nevertheless, when the temperature exceeds 1200° C., the specific surface area of the chromic oxide powder will become small and deteriorate the sinterability, and it is therefore desirable to perform the heat treatment at a temperature of roughly 900° C. to 1200° C. Further, heat treatment in an atmosphere containing oxygen is able to even more effectively eliminate gas components such as moisture, sulfur, carbon, oxygen (free) and nitrogen as a result of the sufficient oxidization of the raw material powder.

Following the foregoing sulfur, the existence of carbon will also influence the generation of cracks in the target. Thus, a method of reducing chromic oxide with carbon or carbides will lead to the increase of carbon, and is inappropriate. Although it would normally suffice to control the sulfur in the chromic oxide, it is also necessary to manage the amount of carbon when using a material with high carbon content or when the mixture of carbon is significant during the manufacturing process.

Further, heat treatment performed in the foregoing atmosphere is able to simultaneously eliminate Na, Fe and Pb contained in the chromic oxide raw material powder. Although it is necessary to use chromic oxide raw material powder of high purity, the foregoing heat treatment will further improve the purity, and it is thereby possible to obtain chromic oxide raw material powder having a purity of 99.95 wt % or higher excluding the foregoing gas components.

Moreover, it is desirable to make the weight loss during intense heating under an inert atmosphere at 1000° C. for 2 hours 0.7% or less. Although the sintering of materials containing chromic oxide is usually performed at 1000° C. or higher, the generation of large amounts of volatile matter of 1000° C. or less will cause cracks in the sintered compact or uneven sintering. Therefore, it is desirable to preliminarily eliminate the volatile matter from the sintering raw material of chromic oxide powder. In light of the above, volatile matter is eliminated from the chromic oxide raw material powder by the foregoing heat treatment until the weight loss under an inert atmosphere at 1000° C. becomes roughly 0.7% or less. It is thereby possible to reduce the generation of volatile matter during sintering. It is also desirable to adjust the average grain size of the raw material powder to be 10 μm or less.

As a result of sintering using the chromic oxide raw material powder obtained as described above, it is possible to make the average crystal grain size and relative density of the sputtering target after sintering 100 μm or less and 90% or higher, respectively. Improvement in the density of the sputtering target will reduce pores, refine the crystal grains and make the sputtered surface of the target uniform and smooth, and yield a significant effect of being able to reduce the generation of particles and nodules during sputtering and prolong the target life.

The target of the present invention covers not only 100% chromic oxide, but it also covers all targets containing chromic oxide. For instance, the present invention can be applied to all targets containing chromic oxide for forming thin films or layers such as an abrasion-resistant protective film, a magnetic recording medium or a magnetic recording medium base film of a thermal head; a black matrix film of a liquid crystal display (LCD) panel; a heat element base film; a dielectric film for a phase-change optical recording medium and the like.

As examples of targets containing such chromic oxides, there are, for instance, a target for forming a base film of a magnetic recording medium composed of $Cr$—$Cr_2O_3$ or a target for forming a thin film of a black panel of an LCD panel, a thermal print head target composed of $CrN$—$Cr_2O_3$, a target composed of an oxide-remnant silicon nitride selected from $Cr_2O_3$—Al, Ti, Zr, Hf, Mg and Y for use in a thermal print head, a target for forming a dielectric film composed of $Cr_2O_3$—$CeO_2$ for use in a phase-change optical recording medium, a Co—Pt—Cr target for forming an oxide magnetic recording medium thin film, and so on.

Even if the chromic oxide only exists in trace amounts, chromic oxide with sulfur or other gas components mixed therein will cause the generation of fractures and cracks. Thus, not only is it an elemental component, chromic oxide will also cause the occurrence of abnormal discharge or the generation of particles and nodules, and a sputtering target containing chromic oxide of 5 molar % or higher will also be subject to the foregoing influence.

In addition, the greater the content of chromic oxide becomes, the influence thereof will also increase. From this perspective, even stricter management of impurities is required since chromic oxide of 20 molar % or higher will have a significant influence, and chromic oxide of 50 molar % or higher will have even a stronger influence.

EXAMPLES

Examples and Comparative Examples of the present invention are now explained. These Examples are merely illustrative, and the present invention shall in no way be limited thereby. In other words, the present invention shall only be limited by the scope of the present invention, and shall include the various modifications other than the Examples of this invention.

Example 1

Chromic oxide ($Cr_2O_3$) powder of 99.8% purity was prepared, and subject to heat treatment in the atmosphere at 1000° C. for 5 hours. The analytical values of impurities before and after the heat treatment are shown in Table 1. The representative impurity content of the raw material powder after heat treatment was 60 wtppm of S, 200 wtppm of C, 50 wtppm of Na, 50 wtppm of Fe, and 0.1 wtppm of Pb. The average grain size of the raw material powder was 2 μm.

The other impurities were as shown in Table 1. Only the key impurities are indicated here. Incidentally, the weight loss in the case of subjecting this powder raw material to intense heating under an inert atmosphere (Ar flow) at 1000° C. for 2 hours was 0.3 wt %.

Subsequently, 8 molar % of chromic powder having a purity of 99.98% (excluding gas components) as a result of eliminating gas components such as sulfur and other volatile components was mixed with the residual quantity of metal chromium powder having a purity of 99.9%, thereafter dry blended, filled in a carbon die, and subject to hot press sintering under the conditions at a temperature of 1100° C. and a pressure of 150 kg/cm².

This sintered compact was subject to finish processing to obtain a target (Cr—$Cr_2O_3$) having Cr as its primary component. The representative impurity content of the sintered compact was 45 wtppm of S, 180 wtppm of C, 5 wtppm of Na, 250 wtppm of Fe, and 10 wtppm of Pb. Incidentally, the increase of Fe in the sintered compact was caused by the Fe contained in the chrome (Cr) raw material powder.

Even in the foregoing case, the total amount of Na, Fe and Pb was 300 wtppm or less. The other impurities were as shown in Table 2. Only the key impurities are indicated here. Similarly, although there was an increase in other impurities (Pb, Al, Si, Cu) deriving from the chrome (Cr) raw material powder, these impurities did not cause cracks in the target having Cr as its primary component shown in the Example.

As described above, the impurity content of the chromic oxide ($Cr_2O_3$) raw material powder after heat treatment and the impurity content of the target after sintering were both within the range of the present invention. The relative density of the target was 97.5% (density of 6.5 g/cm³) and no cracks were generated in the target. The results are shown in Table 2.

TABLE 1

| | $Cr_2O_3$ Heat Treatment Condition °C. | S wtppm | C wtppm | Na wtppm | Fe wtppm | Pb wtppm |
|---|---|---|---|---|---|---|
| Example 1 | 1000° C., Atmosphere, 5 hours | 60 | 200 | 50 | 50 | 0.1 |
| Example 2 | 1200° C., Atmosphere, 5 hours | 10 | 90 | 20 | 40 | 0.1 |
| Example 3 | 900° C., Atmosphere, 48 hours | 90 | 150 | 70 | 50 | 1 |
| Comparative Example 1 | Before Heat Treatment | 300 | 250 | 170 | 200 | 70 |
| Comparative Example 2 | 800° C., Atmosphere, 5 hours | 300 | 200 | — | — | — |
| Comparative Example 3 | 800° C., Atmosphere, 48 hours | 290 | 140 | 70 | 70 | 1 |
| Comparative Example 4 | 900° C., Atmosphere, 24 hours | 160 | 170 | 110 | 60 | 1 |

| | Al wtppm | Si wtppm | Cl wtppm | K wtppm | Ni wtppm | Cu wtppm | Mn wtppm | Weight Loss (%) ※ |
|---|---|---|---|---|---|---|---|---|
| Example 1 | 0.4 | 10 | 0.5 | 1 | 4 | 2 | 0.7 | 0.3 |
| Example 2 | 0.3 | 6 | 0.4 | 0.8 | 3 | 2 | 0.5 | <0.1 |
| Example 3 | 1 | 7 | 2 | 2 | 4 | 3 | 0.6 | 0.6 |
| Comparative Example 1 | 5 | 10 | 20 | 6 | 20 | 5 | 5 | 1.2 |
| Comparative Example 2 | — | — | — | — | — | — | — | 1 |
| Comparative Example 3 | 4 | 10 | 9 | 5 | 4 | 3 | 0.6 | 0.75 |
| Comparative Example 4 | 1.5 | 8 | 3 | 4 | 3 | 3 | 0.8 | 0.8 |

※ Ar flow, 1000° C., 2 h

TABLE 2

| | Composition mol % | S wtppm | C wtppm | Na wtppm | Fe wtppm | Pb wtppm | Al wtppm | Si wtppm |
|---|---|---|---|---|---|---|---|---|
| Example 1 | $Cr:Cr_2O_3$ = 92:8 mol % | 45 | 180 | 5 | 250 | 10 | 50 | 100 |
| Example 2 | $Cr:Cr_2O_3$ = 85:15 mol % | 40 | 80 | 10 | 230 | 8 | 45 | 90 |
| Example 3 | $Cr_2O_3$ | 40 | 130 | 25 | 40 | 0.1 | 0.3 | 5 |
| Example 4 | $ZnS:Cr_2O_3$ = 30:70 mol % | — | 100 | 12 | 30 | 0.1 | 0.1 | 5 |
| Example 5 | $Ta_2O_5:Cr_2O_3$ = 40:60 mol % | 15 | 90 | 50 | 15 | 0.2 | 0.2 | 50 |
| Comparative Example 1 | $Cr:Cr_2O_3$ = 85:15 mol % | 160 | 300 | 50 | 430 | 40 | 45 | 100 |
| Comparative Example 2 | $Cr_2O_3$ | 280 | 230 | 150 | 190 | 30 | 4 | 10 |
| Comparative Example 3 | $Cr_2O_3:Ta_2O_5$ = 60:40 mol % | 150 | 100 | 110 | 200 | 25 | 10 | 70 |
| Comparative Example 4 | $Cr_2O_3$ | 200 | 150 | 150 | 100 | 11 | 3 | 10 |

| | Cl wtppm | K wtppm | Ni wtppm | Cu wtppm | Mn wtppm | Density g/cm3 | Relative Density % | Cracks |
|---|---|---|---|---|---|---|---|---|
| Example 1 | 1 | 1 | 5 | 20 | — | 6.5 | 97.5 | None |
| Example 2 | 1 | 1 | 4 | 18 | — | 5.9 | 92.6 | None |
| Example 3 | 0.2 | 0.5 | 3 | 2 | 0.5 | 5.1 | 97.9 | None |
| Example 4 | 0.3 | 0.8 | 2 | 2 | 0.5 | 4.5 | 91.6 | None |
| Example 5 | 2 | 1 | 2 | 2 | — | 6.8 | 95.8 | None |
| Comparative Example 1 | 1 | 2 | 10 | 18 | — | — | — | Yes |
| Comparative Example 2 | 1 | 1 | 18 | 5 | 2 | — | — | Yes |
| Comparative Example 3 | 2 | 1 | 2 | 2 | — | — | — | Yes |
| Comparative Example 4 | 2 | 3 | 2 | 3 | 2 | — | — | Yes |

Example 2

Chromic oxide ($Cr_2O_3$) powder of 99.8% purity was prepared, and subject to heat treatment in the atmosphere at 1200° C. for 5 hours. The analytical values of impurities before and after the heat treatment are shown in Table 1. The representative impurity content of the raw material powder after heat treatment was 10 wtppm of S, 90 wtppm of C, 20 wtppm of Na, 40 wtppm of Fe, and 0.1 wtppm of Pb. The other impurities were as shown in Table 1. Only the key impurities are indicated here. Incidentally, the weight loss in the case of subjecting this powder raw material to intense heating under an inert atmosphere (Ar flow) at 1000° C. for 2 hours was less than 0.1 wt %.

Subsequently, 15 molar % of chromic powder having a purity of 99.98% (excluding gas components) as a result of eliminating gas components such as sulfur and other volatile components was mixed with the residual quantity of metal chromium powder having a purity of 99.9%, thereafter dry blended, filled in a carbon die, and subject to hot press sintering under the conditions at a temperature of 1130° C. and a pressure of 150 kg/cm².

This sintered compact was subject to finish processing to obtain a target (Cr—$Cr_2O_3$) having Cr as its primary component. The representative impurity content of the sintered compact was 40 wtppm of S, 80 wtppm of C, 10 wtppm of Na, 230 wtppm of Fe, and 8 wtppm of Pb. Incidentally, the increase of Fe in the sintered compact was caused by the Fe contained in the chrome (Cr) raw material powder. Even in the foregoing case, the total amount of Na, Fe and Pb was 300 wtppm or less. The other impurities were as shown in Table 2.

Only the key impurities are indicated here. Similarly, although there was an increase in other impurities (Pb, Al, Si, Cu) deriving from the chrome (Cr) raw material powder, these impurities did not cause cracks in the target having Cr as its primary component shown in Example 2.

As described above, the impurity content of the chromic oxide ($Cr_2O_3$) raw material powder after heat treatment and the impurity content of the target after sintering were both within the range of the present invention. The relative density of the target was 92.6% (density of 5.9 g/cm³), and no cracks were generated in the target. The results are shown in Table 2.

Example 3

Chromic oxide ($Cr_2O_3$) powder of 99.8% purity was prepared, and subject to heat treatment in the atmosphere at 900° C. for 48 hours. The analytical values of impurities before and after the heat treatment are shown in Table 1. The representative impurity content of the raw material powder after heat treatment was 90 wtppm of S, 150 wtppm of C, 70 wtppm of Na, 50 wtppm of Fe, and 1 wtppm of Pb. The other impurities were as shown in Table 1. Only the key impurities are indicated here. Incidentally, the weight loss in the case of subjecting this powder raw material to intense heating under an inert atmosphere (Ar flow) at 1000° C. for 2 hours was 0.6 wt %.

Subsequently, chromic powder having a purity of 99.98% (excluding gas components) as a result of eliminating gas components such as sulfur and other volatile components was filled in a carbon die, and subject to hot press sintering under the conditions at a temperature of 1130° C. and a pressure of 150 kg/cm².

This sintered compact was subject to finish processing to obtain a target ($Cr_2O_3$). The representative impurity content of the sintered compact was 40 wtppm of S, 130 wtppm of C, 25 wtppm of Na, 40 wtppm of Fe, and 0.1 wtppm of Pb. The other impurities were as shown in Table 2. Only the key impurities are indicated here. As shown in Table 2, all impurities were reduced even further by sintering.

As described above, the impurity content of the chromic oxide ($Cr_2O_3$) raw material powder after heat treatment and the impurity content of the target after sintering were both within the range of the present invention. The relative density of the target was 97.9% (density of 5.1 g/cm³), and no cracks were generated in the target. The results are shown in Table 2.

Example 4

Using the chromic oxide ($Cr_2O_3$) as the raw material powder after the same heat treatment as Example 1, 70 molar % of chromic powder having a purity of 99.98% (excluding gas components) as a result of eliminating gas components such as sulfur and other volatile components was mixed with the residual quantity of zinc sulfide (ZnS) powder having a purity of 99.99%. The mixed powder was thereafter filled in a carbon die, and subject to hot press sintering under the conditions at a temperature of 1100° C. and a pressure of 150 kg/cm².

This sintered compact was subject to finish processing to obtain a target (ZnS—$Cr_2O_3$) having $Cr_2O_3$ as its primary component. The representative impurity content of the sintered compact was S as the component element, 100 wtppm of C, 12 wtppm of Na, 30 wtppm of Fe, and 0.1 wtppm of Pb. The other impurities were as shown in Table 2. Only the key impurities are indicated here. As shown in Table 2, all impurities were reduced even further by sintering.

As described above, the impurity content of the chromic oxide ($Cr_2O_3$) raw material powder after heat treatment and the impurity content of the target (ZnS—$Cr_2O_3$) after sintering were both within the range of the present invention. The relative density of the target was 91.6% (density of 4.5 g/cm³), and no cracks were generated in the target. The results are shown in Table 2.

Example 5

Using the chromic oxide ($Cr_2O_3$) as the raw material powder after the same heat treatment as Example 1, 60 molar % of chromic powder having a purity of 99.98% (excluding gas components) as a result of eliminating gas components such as sulfur and other volatile components was mixed with the residual quantity of tantalum pentoxide ($Ta_2O_5$) powder having a purity of 99.9%. The mixed powder was thereafter filled in a carbon die, and subject to hot press sintering under the conditions at a temperature of 1250° C. and a pressure of 200 kg/cm².

This sintered compact was subject to finish processing to obtain a target ($Ta_2O_5$—$Cr_2O_3$) having $Cr_2O_3$ as its primary component. The representative impurity content of the sintered compact was 15 wtppm of S, 90 wtppm of C, 50 wtppm of Na, 15 wtppm of Fe, and 0.2 wtppm of Pb.

The other impurities were as shown in Table 2. Only the key impurities are indicated here. Similarly, although there was an increase in other impurities (Pb, Si, Cl, Cu) deriving from the $Ta_2O_5$ raw material powder, these impurities did not cause cracks in the target having $Cr_2O_3$ as its primary component shown in the Example.

As described above, the impurity content of the chromic oxide ($Cr_2O_3$) raw material powder after heat treatment and the impurity content of the target after sintering were both within the range of the present invention. The relative density of the target was 95.8% (density of 6.8 g/cm³), and no cracks were generated in the target. The results are shown in Table 2.

Comparative Example 1

The analytical values of impurities of chromic oxide ($Cr_2O_3$) powder of 99.8% purity are shown in Table 1. The representative impurity content of the raw material powder was 300 wtppm of S, 250 wtppm of C, 170 wtppm of Na, 200 wtppm of Fe, and 70 wtppm of Pb. The other impurities were as shown in Table 1. Only the key impurities are indicated here. Incidentally, the weight loss in the case of subjecting this powder raw material to intense heating under an inert atmosphere (Ar flow) at 1000° C. for 2 hours was 1.2 wt %.

Subsequently, 15 molar % of chromic powder having a purity of 99.98% was mixed with the residual quantity of metal chromium powder having a purity of 99.9%, thereafter dry blended, filled in a carbon die, and subject to hot press sintering under the conditions at a temperature of 1100° C. and a pressure of 150 kg/cm².

The representative impurity content of the sintered compact (Cr—$Cr_2O_3$) having Cr as its primary component was 160 wtppm of S, 300 wtppm of C, 50 wtppm of Na, 430 wtppm of Fe, and 40 wtppm of Pb. As described above, the impurity content of the chromic oxide ($Cr_2O_3$) raw material powder after heat treatment and the impurity content of the sintered compact after sintering were both outside the range of the present invention.

When attempting to process this sintered compact as with Example 1, the target cracked and could not withstand the usage as a target. Accordingly, it was practically difficult to measure the relative density. The results are shown in Table 2.

Comparative Example 2

Chromic oxide ($Cr_2O_3$) powder of 99.8% purity was prepared, and subject to heat treatment in the atmosphere at 800° C. for 5, hours. The analytical values of impurities before and after the heat treatment are shown in Table 1. The representative impurity content of the raw material powder after heat treatment was 300 wtppm of S and 200 wtppm of C. The weight loss in the case of subjecting this powder raw material to intense heating under an inert atmosphere (Ar flow) at 1000° C. for 2 hours was 1 wt %.

Subsequently, chromic powder after heat treatment was filled in a carbon die, and subject to hot press sintering under the conditions at a temperature of 1200° C. and a pressure of 150 kg/cm². The representative impurity content of the sintered compact ($Cr_2O_3$) was 280 wtppm of S, 230 wtppm of C, 150 wtppm of Na, 190 wtppm of Fe, and 30 wtppm of Pb. The results are shown in Table 2.

As shown in Table 2, the impurity content of the chromic oxide ($Cr_2O_3$) raw material powder after heat treatment and the impurity content of the sintered compact after sintering were both outside the range of the present invention. When attempting to process this sintered compact as with Example 1, the target cracked and could not withstand the usage as a target. Accordingly, it was practically difficult to measure the relative density.

Comparative Example 3

Chromic oxide ($Cr_2O_3$) powder of 99.8% purity was prepared, and subject to heat treatment in the atmosphere at 800° C. for 48 hours. The analytical values of impurities before and after the heat treatment are shown in Table 1. The representative impurity content of the raw material powder after heat treatment was 290 wtppm of S, 140 wtppm of C, 70 wtppm of Na, and 70 wtppm of Fe. The weight loss in the case of subjecting this powder raw material to intense heating under an inert atmosphere (Ar flow) at 1000° C. for 2 hours was 0.75 wt %.

60 molar % of chromic powder was mixed with the residual quantity of tantalum pentoxide ($Ta_2O_5$) powder having a purity of 99.9%. The mixed powder was thereafter filled in a carbon die, and subject to hot press sintering under the conditions at a temperature of 1250° C. and a pressure of 200 kg/cm².

The representative impurity content of the sintered compact ($Ta_2O_5$—$Cr_2O_3$) having $Cr_2O_3$ as its primary component was 150 wtppm of S, 100 wtppm of C, 110 wtppm of Na, 200 wtppm of Fe, and 25 wtppm of Pb.

The results are shown in Table 2. As shown in Table 2, the impurity content of the chromic oxide ($Cr_2O_3$) raw material powder after heat treatment and the impurity content of the sintered compact after sintering were both outside the range of the present invention. When attempting to process this sintered compact as with Example 1, the target cracked and could not withstand the usage as a target. Accordingly, it was practically difficult to measure the relative density.

Comparative Example 4

Chromic oxide ($Cr_2O_3$) powder of 99.8% purity was prepared, and subject to heat treatment in the atmosphere at 900° C. for 24 hours. The analytical values of impurities before and after the heat treatment are shown in Table 1. The representative impurity content of the raw material powder after heat treatment was 160 wtppm of S, 170 wtppm of C, 110 wtppm of Na, and 60 wtppm of Fe. The weight loss in the case of subjecting this powder raw material to intense heating under an inert atmosphere (Ar flow) at 1000° C. for 2 hours was 0.8 wt %. This chromic oxide powder was filled in a carbon die, and subject to hot press sintering under the conditions at a temperature of 1200° C. and a pressure of 200 kg/cm².

The representative impurity content of the sintered compact ($Cr_2O_3$) was 200 wtppm of S, 150 wtppm of C, 150 wtppm of Na, 100 wtppm of Fe, and 11 wtppm of Pb.

The results are shown in Table 2. As shown in Table 2, the impurity content of the chromic oxide ($Cr_2O_3$) raw material powder after heat treatment and the impurity content of the sintered compact after sintering were both outside the range of the present invention. When attempting to process this sintered compact as with Example 1, the target cracked and could not withstand the usage as a target. Accordingly, it was practically difficult to measure the relative density.

As evident from the comparison of the foregoing Examples and the Comparative Examples, the present invention yields a superior effect in being able to increase the purity of chromic oxide itself, and in particular being able to prevent cracks, increase the sintered density and inhibit pores upon manufacturing a sputtering target by reducing sulfur and carbon as much as possible. In addition, the present invention provides chromic oxide powder for a sputtering target adaptable to the above. As shown in the Examples, the present invention can be broadly applied to sintered compacts containing a prescribed amount of chromic oxide.

The high density sputtering target of the present invention obtained by sintering high purity chromic oxide powder in which the purity of chromic oxide itself is increased and the content of sulfur and carbon was reduced as much as possible is capable of preventing cracks and increasing the sintered density upon manufacturing the sputtering target, and further capable of refining the crystal grains and inhibiting pores.

Since this will yield an effect of being able to inhibit the generation of particles and nodules caused by impurities as well as the occurrence of abnormal discharge, for instance, the present invention can be applied to numerous targets containing chromic oxide for forming thin films or layers such as an abrasion-resistant protective film, a magnetic recording medium or a magnetic recording medium base film of a thermal head; a black matrix film of a liquid crystal display (LCD) panel; a heat element base film; a dielectric film for a phase-change optical recording medium and the like.

The invention claimed is:

1. A sputtering target comprising a sintered body containing 8 molar % or higher of chromium oxide and having a sulfur content of greater than 0 wtppm to 45 wtppm, a carbon content of greater than 0 wtppm to 180 wtppm, and a purity of 99.95 wt % or higher, excluding gas components of moisture, carbon, free oxygen, nitrogen and sulfur, and wherein the sintered body has a relative density of 90% or higher and an average crystal grain size of 100 μm or less.

2. The sputtering target according to claim 1, wherein the sulfur content of the sintered body is greater than 0 wt ppm to 30 wtppm.

3. The sputtering target according to claim 1, wherein a total amount of Na, Fe and Pb as impurities in the sintered body is 300 wtppm or less.

4. A sputtering target according to claim 1, wherein the sputtering target contains 20 molar % or higher of the chromium oxide.

5. A sputtering target according to claim 4, wherein the sputtering target contains 50 molar % or higher of the chromium oxide.

* * * * *